United States Patent
Bicakci et al.

(10) Patent No.: US 6,967,609 B1
(45) Date of Patent: Nov. 22, 2005

(54) METHOD AND APPARATUS FOR DYNAMICALLY BIASING SWITCHING ELEMENTS IN CURRENT-STEERING DAC

(75) Inventors: Ara Bicakci, San Jose, CA (US); Gurjinder Singh, Gilroy, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/987,240

(22) Filed: Nov. 12, 2004

(51) Int. Cl.[7] .............................................. H03M 1/66
(52) U.S. Cl. ....................... 341/144; 341/172; 341/150
(58) Field of Search .................................. 341/141–172

(56) References Cited

U.S. PATENT DOCUMENTS

| | | | |
|---|---|---|---|
| 5,790,060 A * | 8/1998 | Tesch .......................... | 341/144 |
| 6,166,670 A * | 12/2000 | O'Shaughnessy ........... | 341/145 |
| 6,218,971 B1 * | 4/2001 | Sugihara ...................... | 341/110 |
| 6,433,722 B1 * | 8/2002 | Gata et al. ................... | 341/144 |
| 6,518,906 B2 | 2/2003 | Abel et al. ................... | 341/144 |
| 6,639,534 B2 * | 10/2003 | Khoini-Poorfard et al. . | 341/144 |
| 6,842,132 B2 * | 1/2005 | Schafferer ................... | 341/144 |

OTHER PUBLICATIONS

Sugnkyung Park et al., "A Digital-to-Analog Converter Based on Differential-Quad Switching", IEEE, Oct. 2, 2002, vol. 37, No. 10, pp. 1335-1338.
W. Schofield et al., "A 16b 400MS/s DAC with <-80dBc IMD to 300MHz and <-160dBm/Hz Noise Power Spectral Density", IEEE, 2003, pp. 126-127, no month.

* cited by examiner

*Primary Examiner*—Lam T. Mai
(74) *Attorney, Agent, or Firm*—Thelen Reid & Priest, LLP

(57) ABSTRACT

A circuit dynamically biases switching elements in a current-steering digital-to-analog converter (DAC), The DAC includes, in each cell, a current source coupled to a current node, a first switching element coupled between the current node and a first DAC output node, and a second switching element coupled between the current node and a second DAC output node. The circuit includes first and second inputs coupled to the first and second DAC output nodes, respectively, first and second outputs coupled to the first and second switching elements, respectively, and a third output coupled to the first and second switching elements. The first and second outputs provide a first ON bias voltage and a second ON bias voltage to control the first and second switching elements, respectively, such that a voltage at the current node is maintained at a predetermined voltage. The third output provides a common OFF bias voltage.

26 Claims, 12 Drawing Sheets

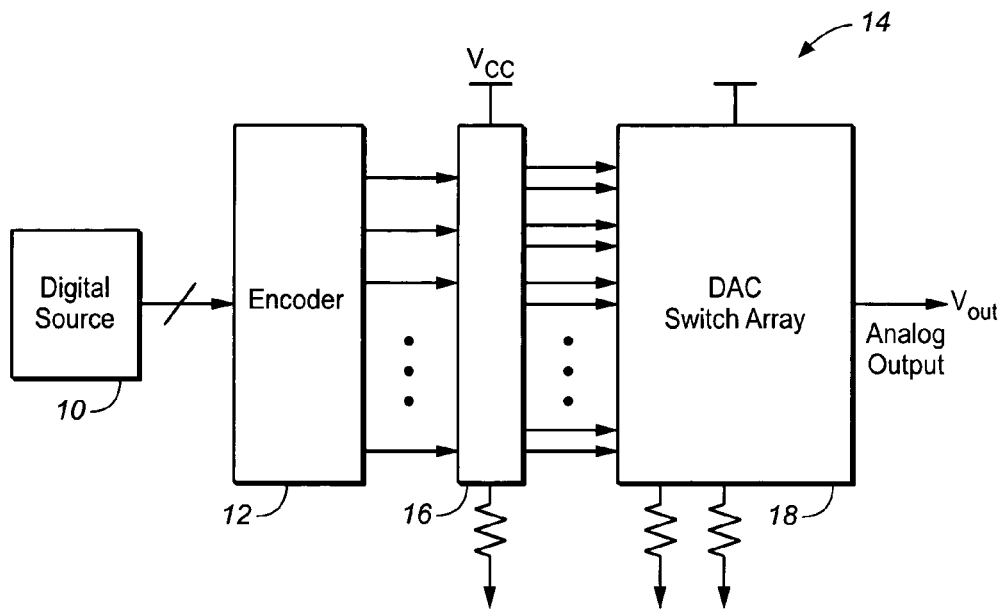
FIG._1A
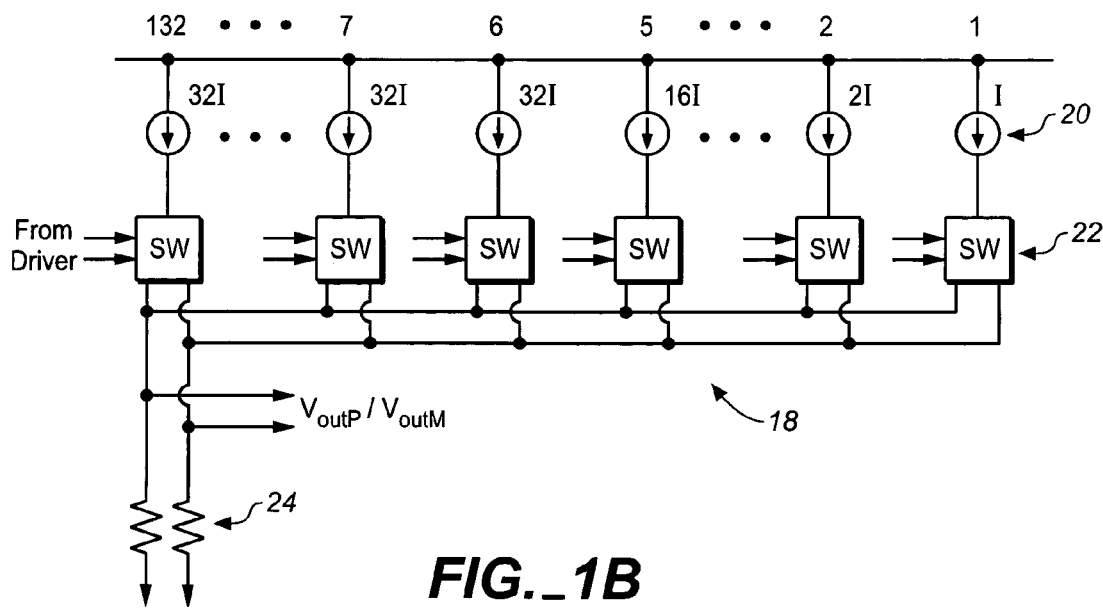
FIG._1B

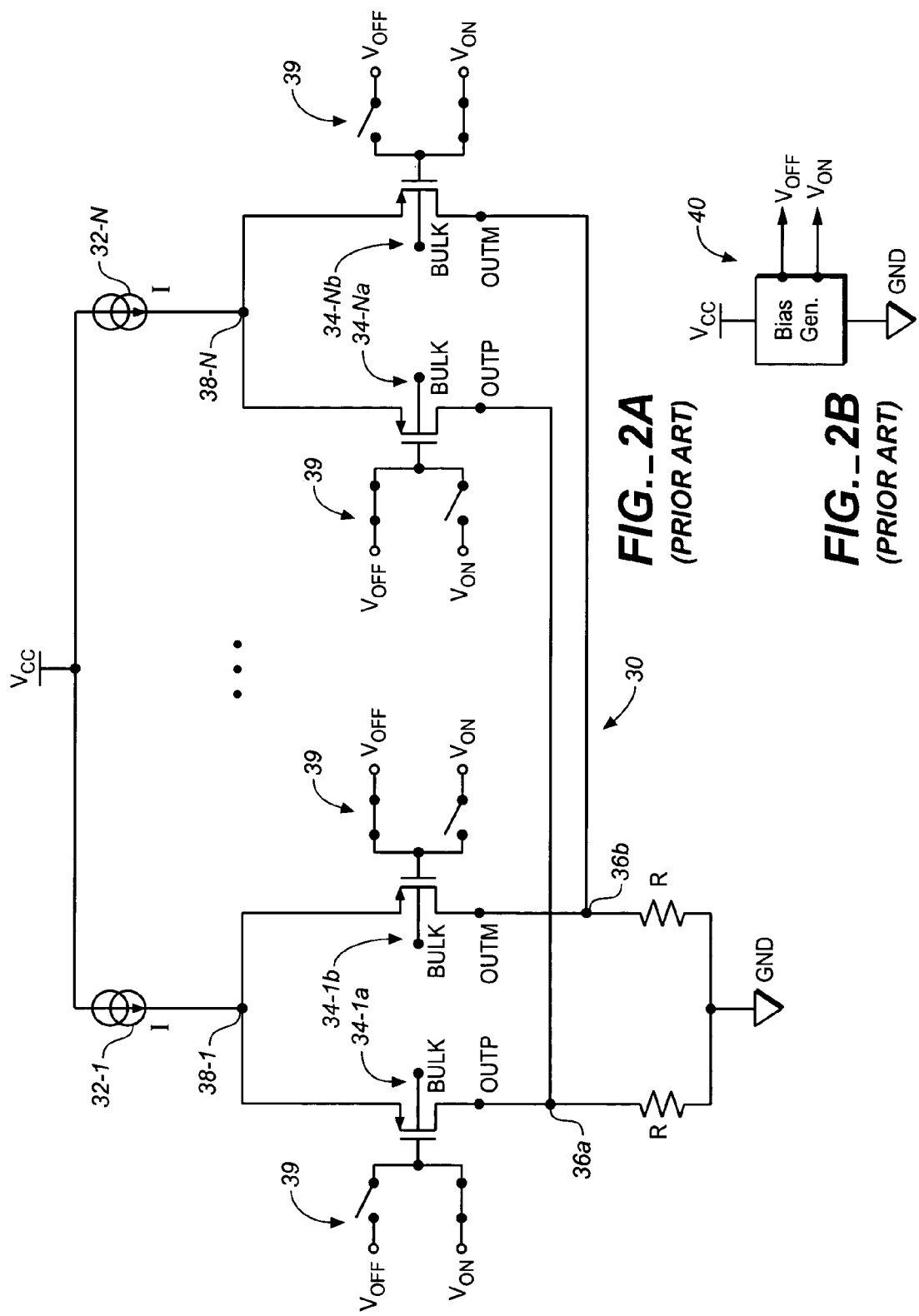
FIG._2A (PRIOR ART)
FIG._2B (PRIOR ART)

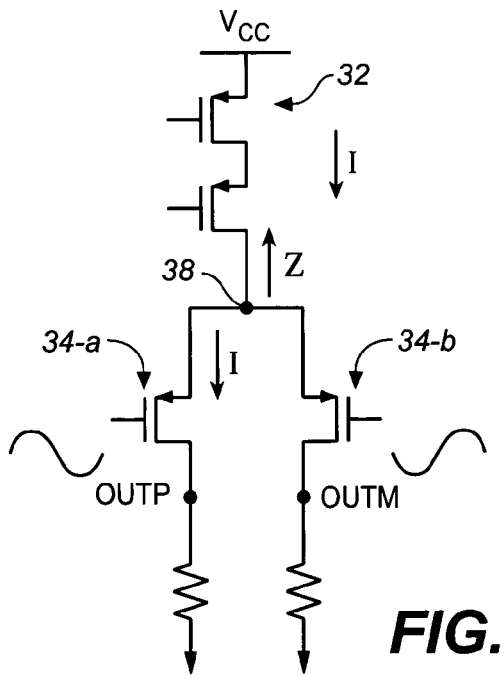
FIG._3A
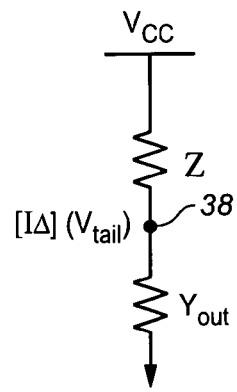
FIG._3B
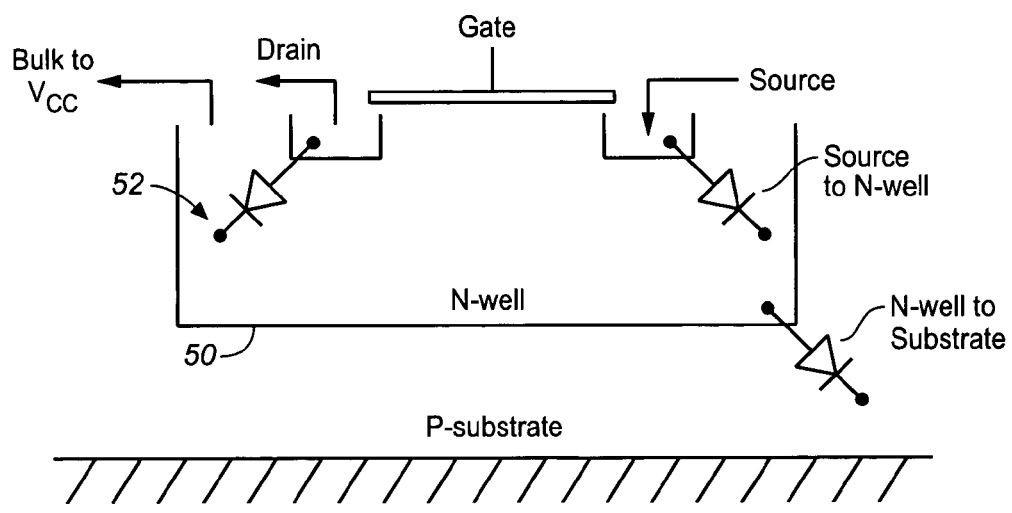
FIG._6

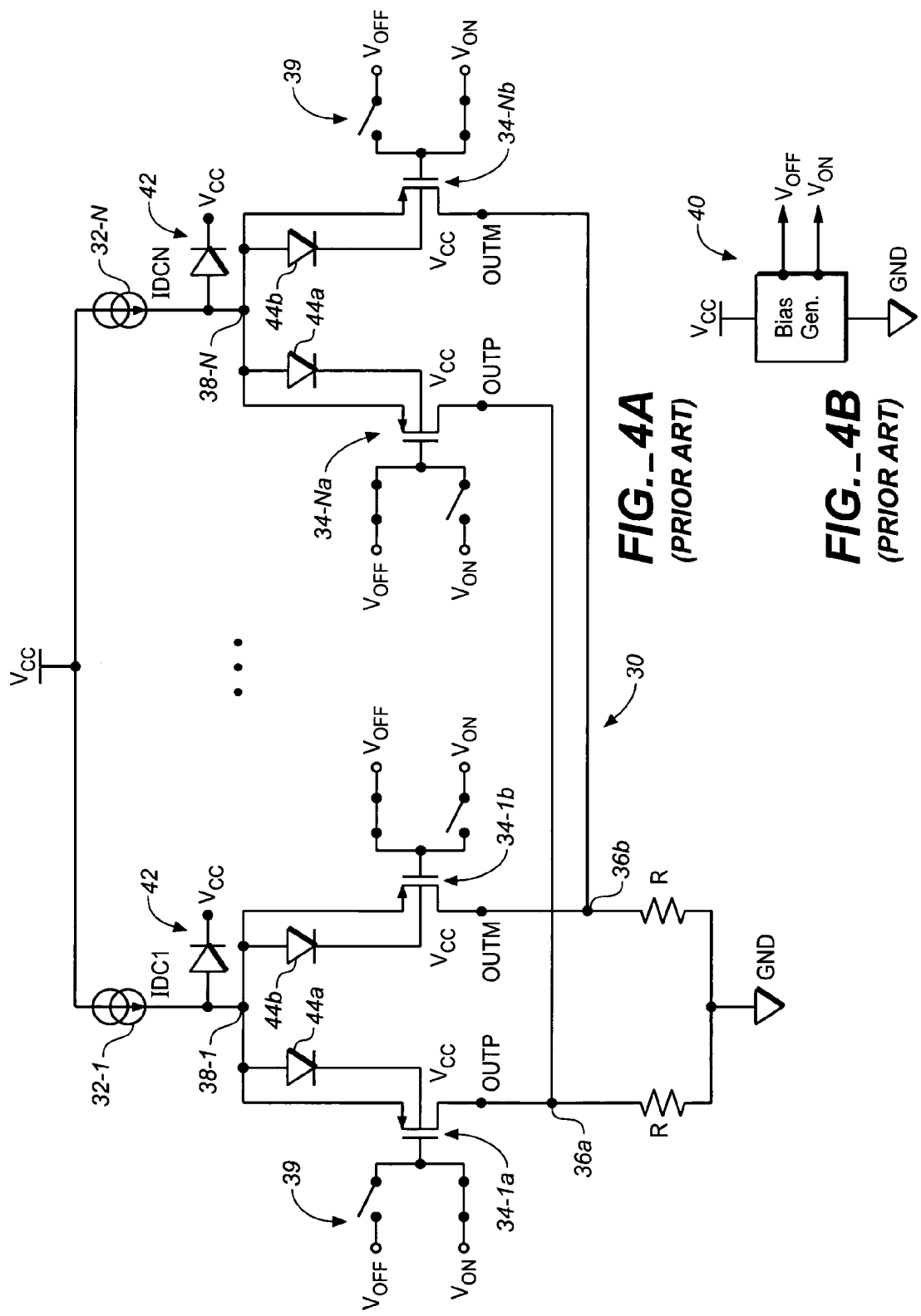
FIG._4A (PRIOR ART)
FIG._4B (PRIOR ART)

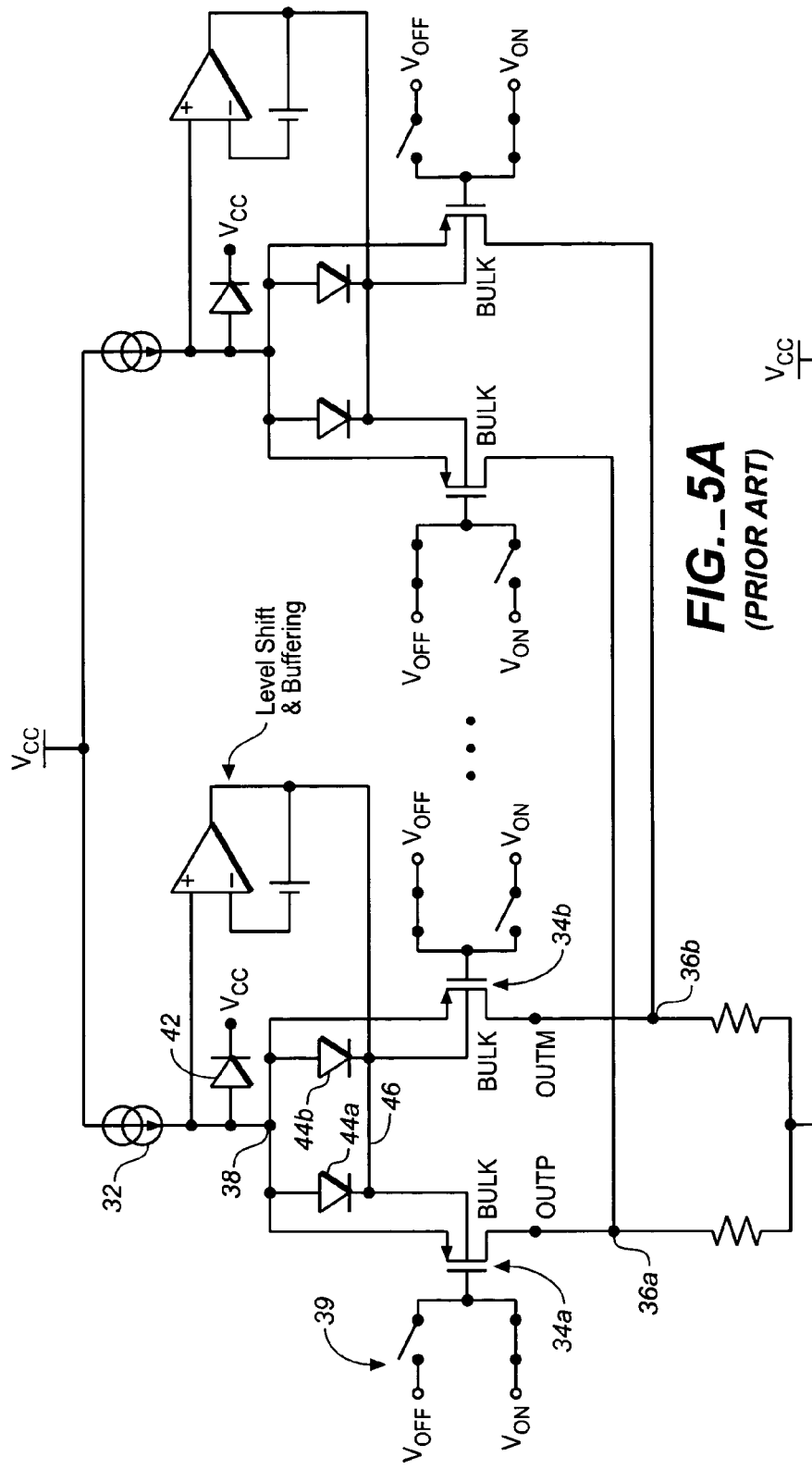
FIG._5A
*(PRIOR ART)*
FIG._5B
*(PRIOR ART)*

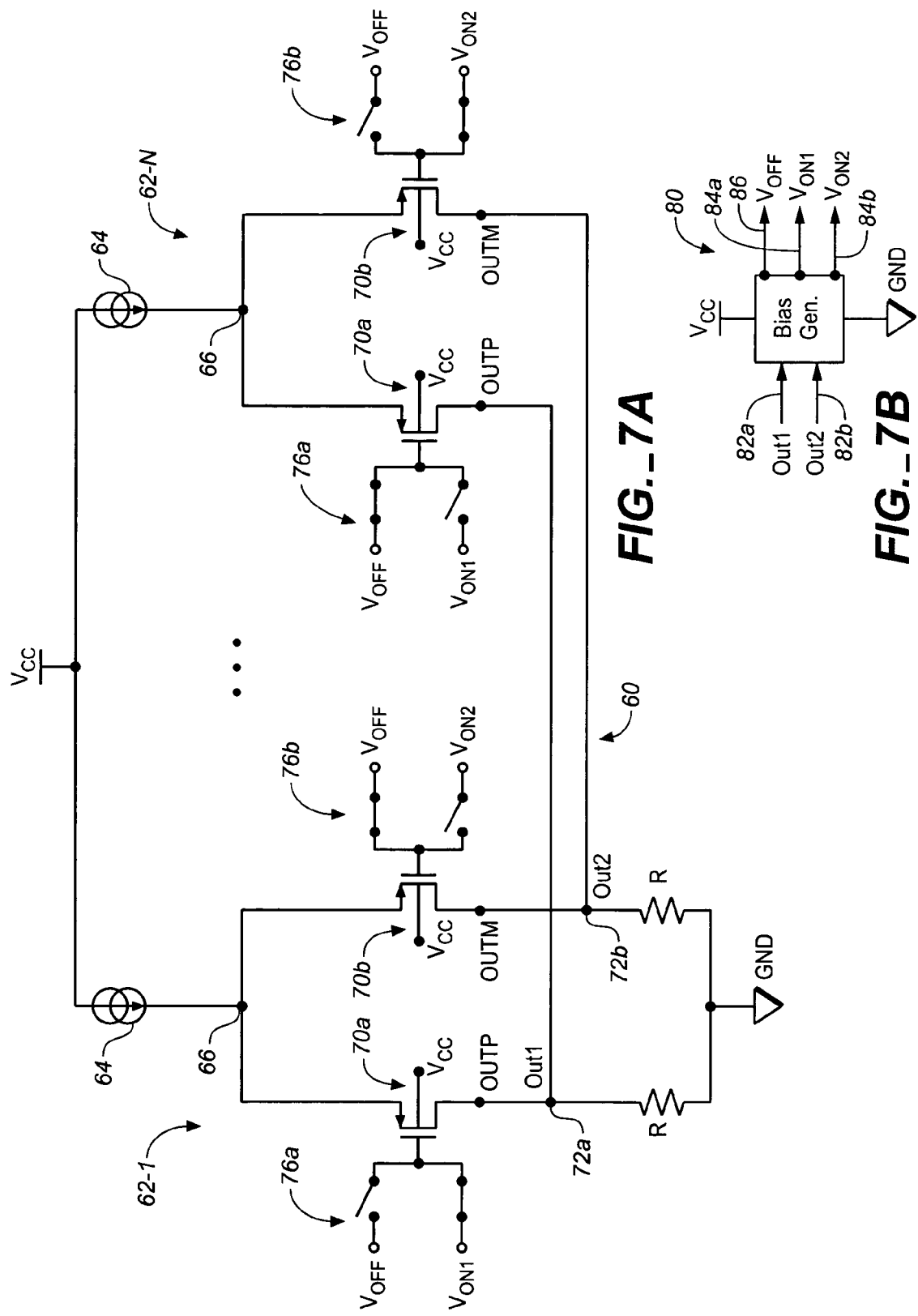

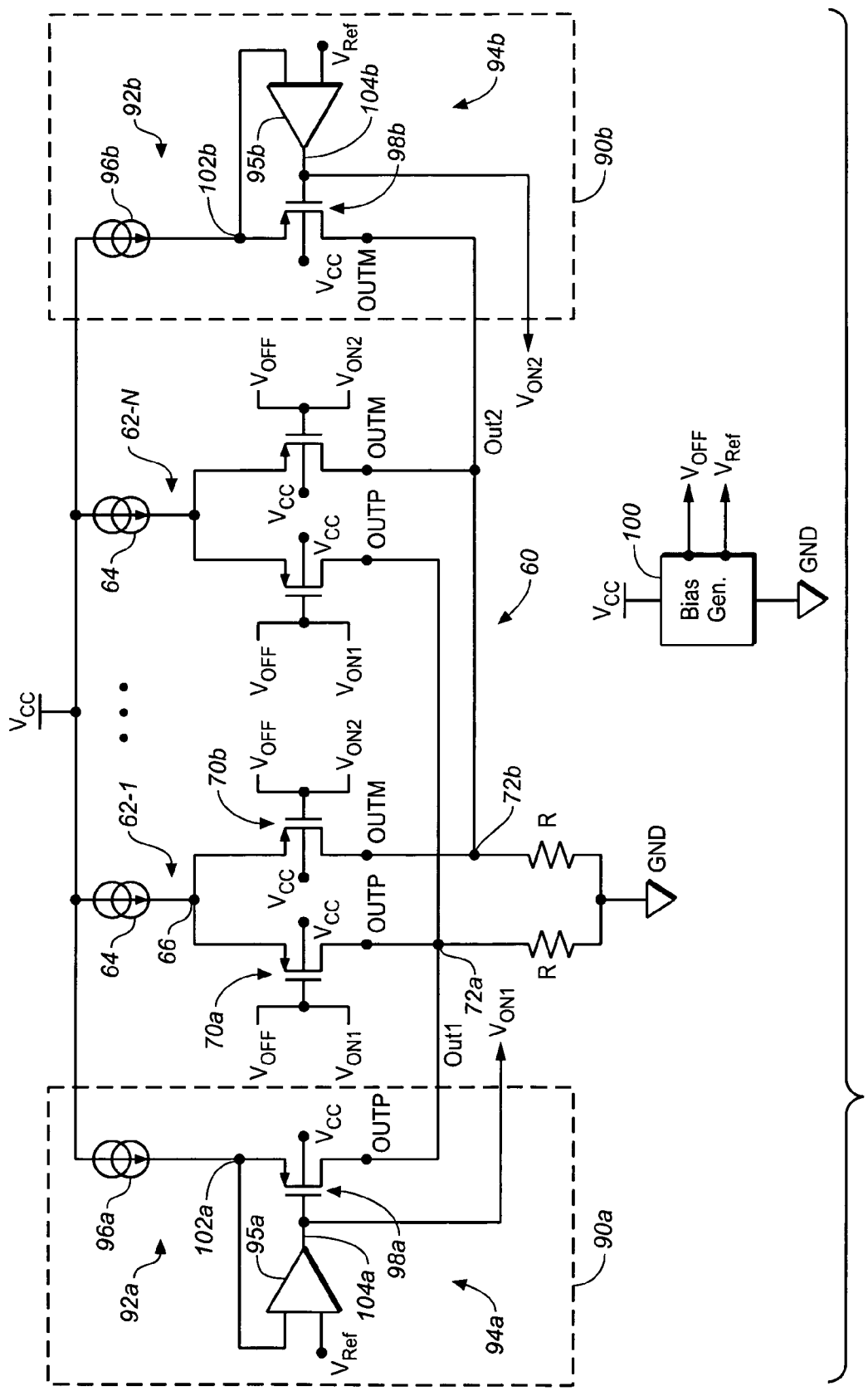
FIG._8

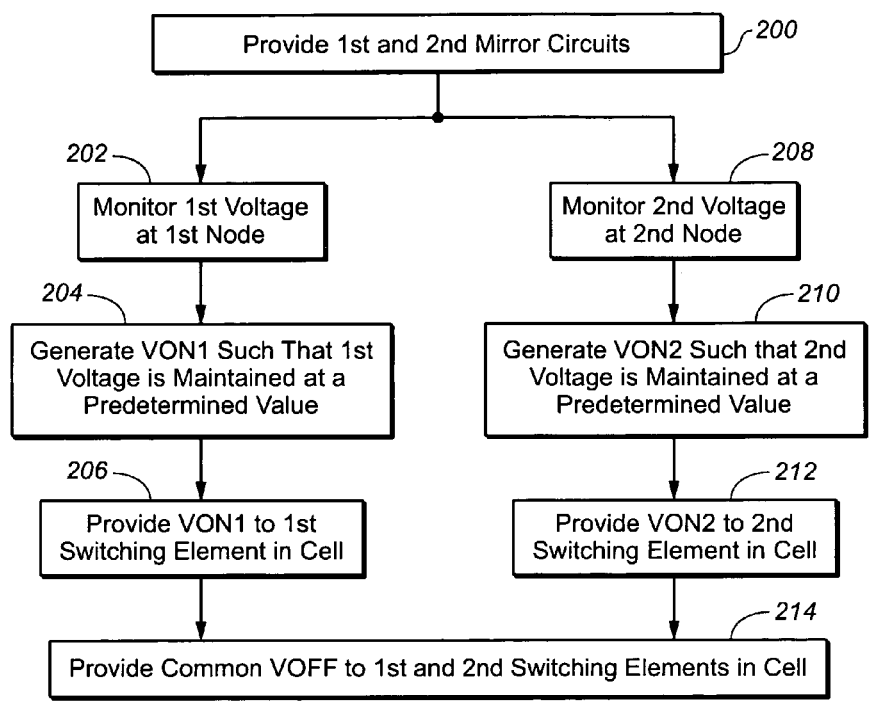
FIG._9

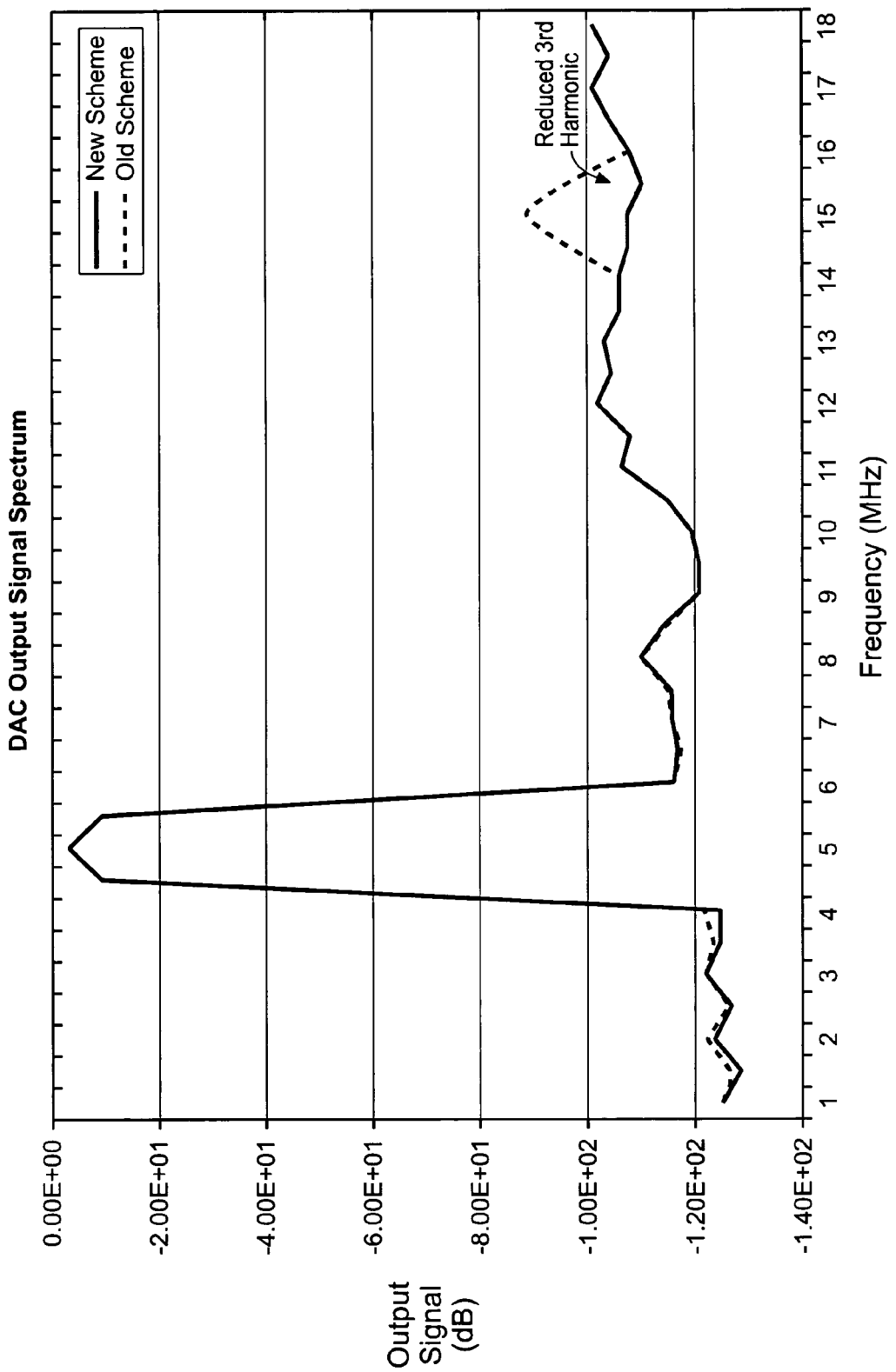
FIG._10

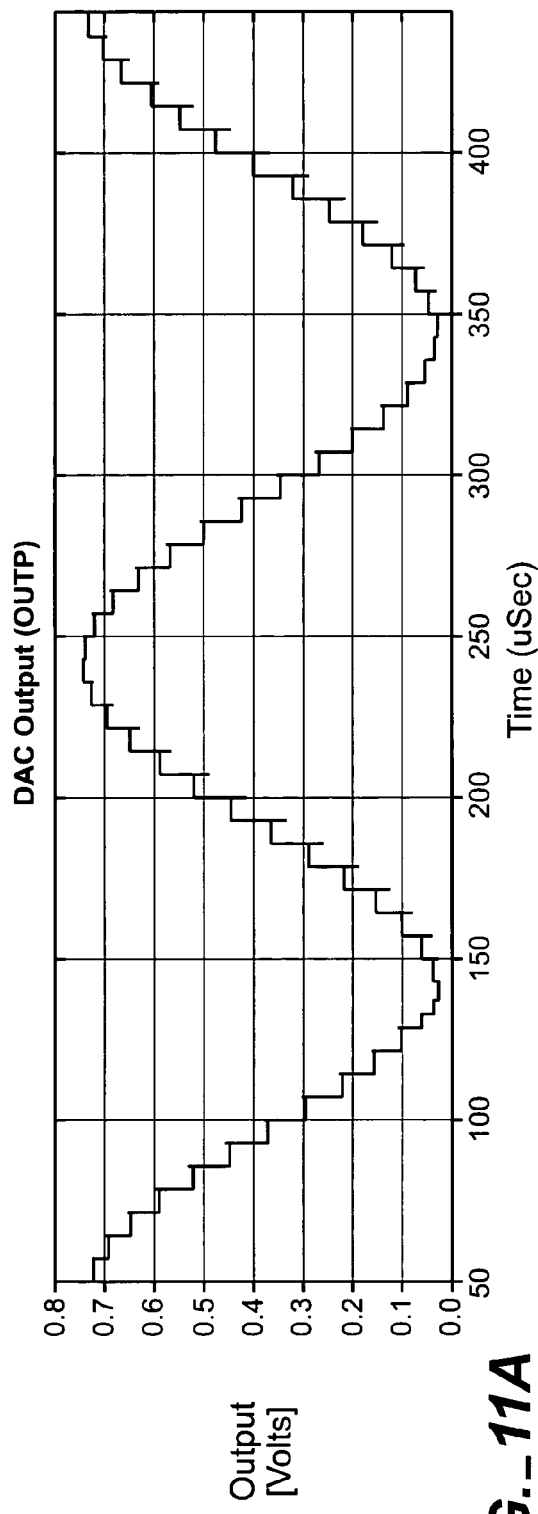
FIG._11A
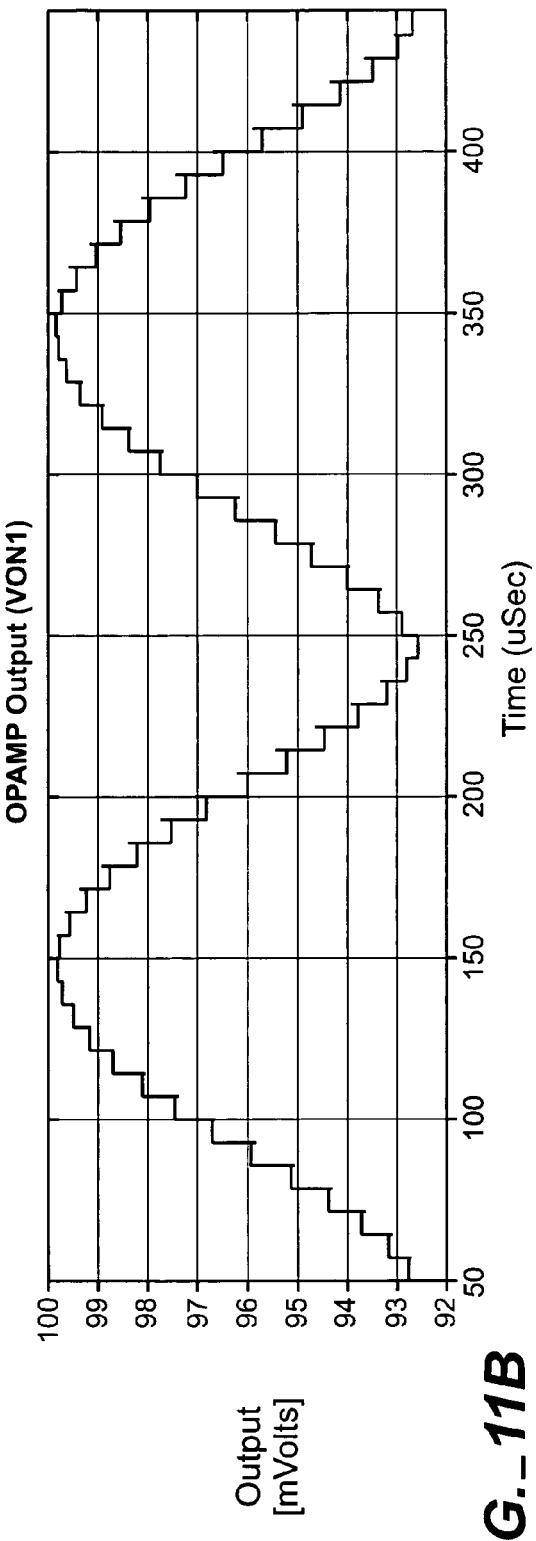
FIG._11B

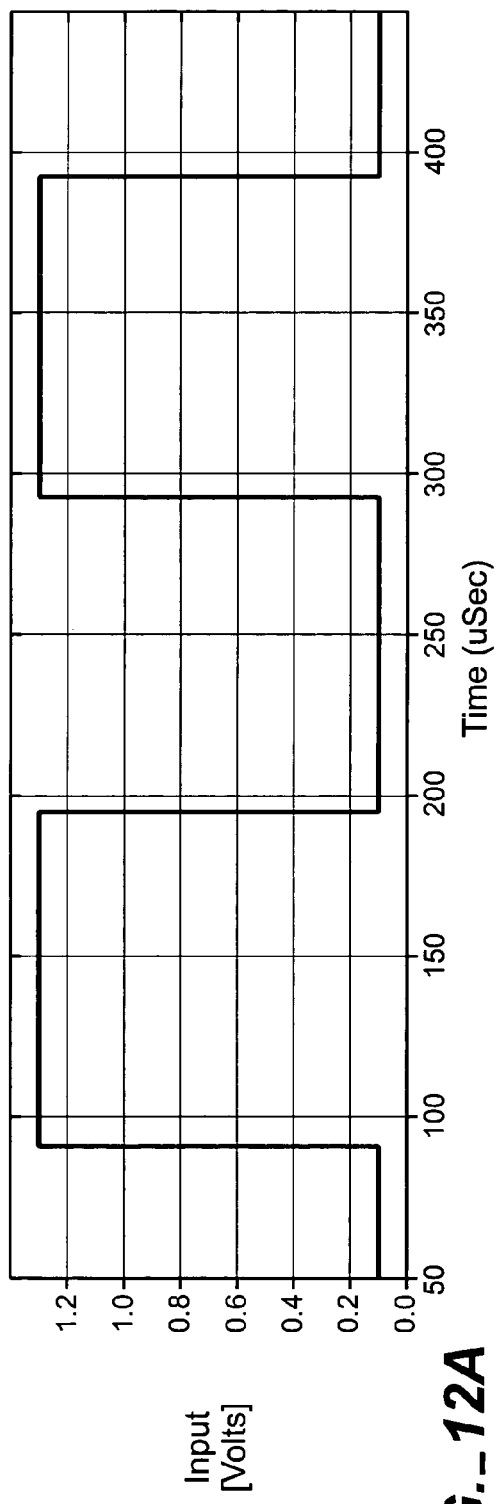
FIG._12A
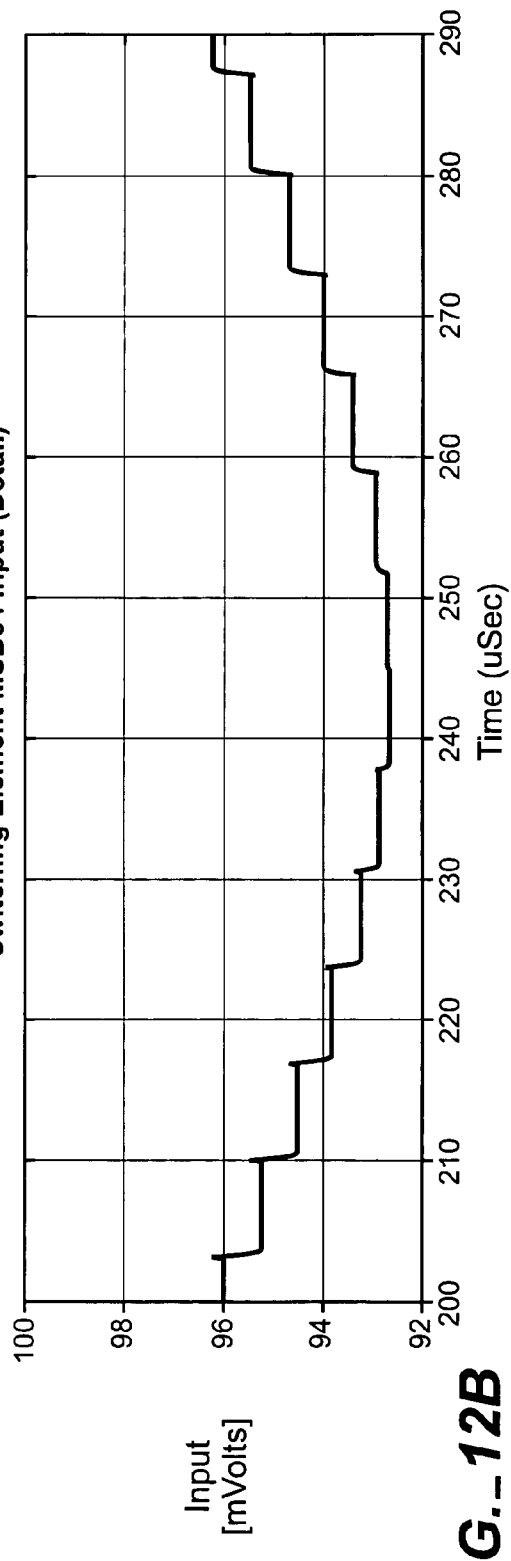
FIG._12B

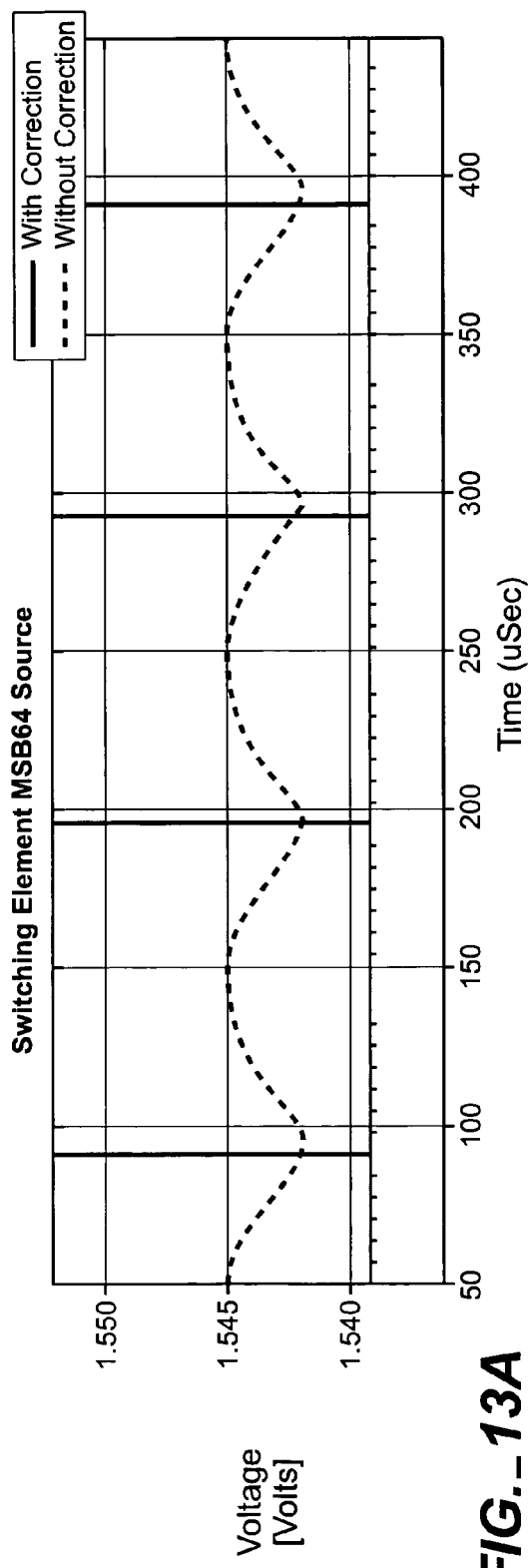
FIG._13A
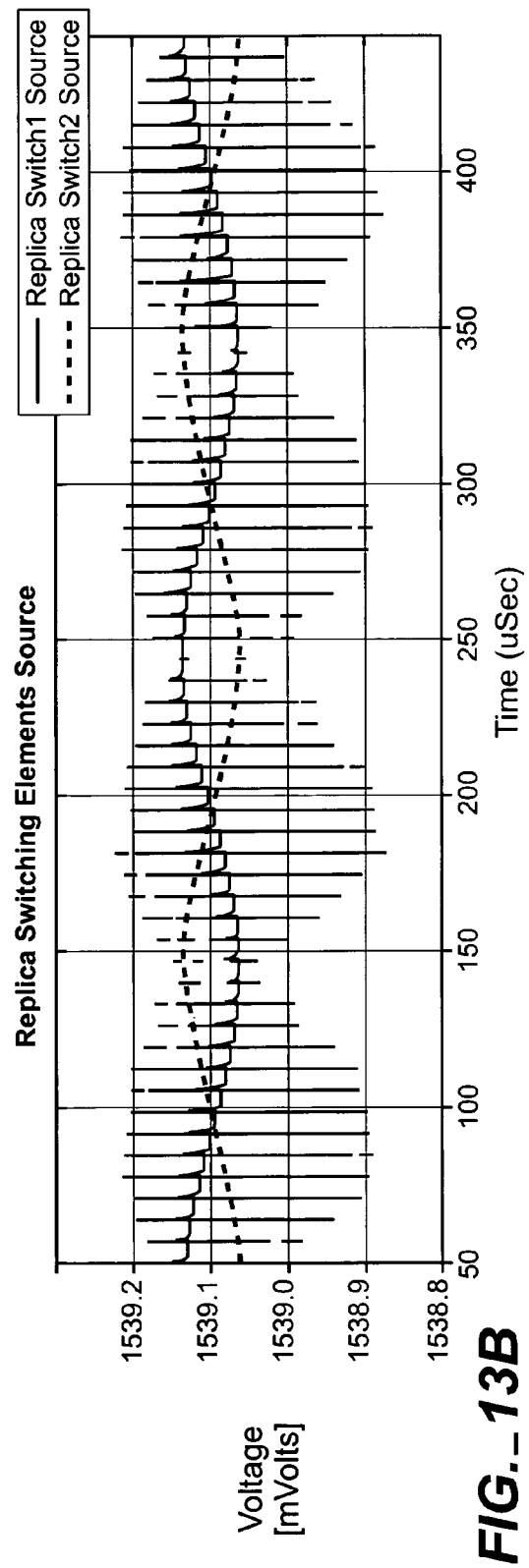
FIG._13B

METHOD AND APPARATUS FOR DYNAMICALLY BIASING SWITCHING ELEMENTS IN CURRENT-STEERING DAC

FIELD OF THE INVENTION

The present invention relates to a mixed-signal circuit. More particularly, the present invention relates to a method and apparatus for dynamically biasing switching elements in a current steering digital-to-analog converter (DAC).

BACKGROUND OF THE INVENTION

Current steering DACs are widely used in applications requiring both high speed and high linearity. FIG. 1A schematically illustrates a conventional digital-to-analog interface including a digital signal source 10, an encoder 12, and a current steering DAC 14 which includes a driver circuit (switch driver array) 16 and a DAC switch array (core DAC) 18. A digital signal (code) from the digital signal source 10 is supplied to the driver circuit 16 through the encoder 12, and converted into an analog signal by the DAC switch array 18.

FIG. 1B schematically illustrates an example of the switch array 18 of a segmented current steering DAC having thermometer-coded upper seven bits (MSB) and binary coded lower 5 bits (LSB). As shown in FIG. 1B, a typical current steering DAC includes current elements (current sources) 20 which are switched by switches (SW) 22 to a load (resistance) 24 according to the input digital data. In this example, the switch array 18 includes 132 switches 22. The first five switches (LSB: 1 to 5) are for the binary code and thus are coupled to the binary-weighted current sources 20 (I to 16I). The remaining 127 switches 22 are for the thermometer code (MSB: 7 to 132) and thus coupled to the identical current sources 20 (32I). The corresponding output of the switch driver 16 drives each switch 22 so as to steer the corresponding current source output to one DAC output (Vout$_P$) or its complementary (Vout$_M$).

In most high-speed applications, a fully differential implementation is employed and the load consists of a pair of identical resistors. Furthermore, a fully segmented architecture or one which is heavily segmented is typically used to enhance the dynamic behavior. FIGS. 2A and 2B schematically illustrate a typical DAC 30 and a corresponding bias generator 40. The DAC 30 includes N identical unit currents sources 32 (32-1, 32-2, . . . , 32-N) which are steered to either one of the DAC output 36a (OUTP) or output 36b (OUTM) based on the input digital code. As shown in FIG. 2B, the bias generator 40 creates constant bias voltages VON (a lower voltage in this example) and VOFF (a high voltage in this example) that are applied in a complementary fashion to each of the switch transistors 34 (34-1a, 34-1b, . . . 34-Na, 34-Nb) through driver circuit switches 39. It is assumed that the switch transistors 34 are operated in saturation region to achieve best dynamic performance. For example, the ON bias voltage VON is applied to the transistor 34a while the OFF voltage VOFF is applied to the transistor 34b such that only the transistor 34a conducts and the current I is driven through the output node 36a (OUTP).

Typically, the current sources 32 are realized using transistors as shown in FIG. 3A. In this widely used circuit topology, one of the major limitations of the dynamic performance of the DAC (e.g., spurious free dynamic range (SFDR)) is the finite impedance of the current sources 32 at the operating frequency. Since the total impedance Z seen at the tail node 38 is not infinite, the output signal OUTP or OUTM appears at the tail node 38, depending on whether the switch 34-a or 34-b conducts. Hence, a partially rectified and attenuated version of the output waveform (a signal swing) shows up at each tail node 38. FIG. 3B schematically illustrates an equivalent circuit when one of the switches is conducting. The current I is not constant as it should be, but varies as a function of a voltage (V$_{tail}$) at the tail node 38 in a signal-dependent manner.

FIG. 4A schematically illustrates several non-linear capacitances connected to nodes in the conventional DAC 30, which are inherently formed because of the semiconductor process structure of the transistors in the circuit. FIG. 4B schematically illustrates the corresponding bias generator 40 for the DAC 30. These capacitances are due to the reverse biased junction diodes 42, 44a and 44b that exist at the source and drain junctions of CMOS transistors. A non-linear, signal-dependent current flows through these diodes 42, 44a and 44b, which is essentially subtracted or added to the current (IDC1, . . . , IDCN) which would nominally flow into the load (R). Although the differential operation of the DAC switching suppresses the even order harmonics, the rectification process combined with non-linear junction capacitors generates odd order harmonics which cannot be suppressed. This distortion mechanism is the dominant one at mid to high digital-to-analog conversion speeds.

All conventional solutions known to the applicants try to minimize the non-linear current flowing into and out of the tail node 38. One of such conventional solutions is the "brute force" approach, which consists of connecting source-body of the switch transistors. This approach essentially bootstraps the diodes at the source of switch transistors 34a and 34b. However, the drain diode 42 of the current sources IDC continues to conduct non-linear current. Furthermore, a large capacitance due to the N-well where the PMOS switches reside, is added to the tail node 35. N-well is now biased at a lower potential that reduces the reverse bias on it and hence increases both the well and junction capacitances. Particularly, the junction capacitances at the drain of the switches 34 (i.e. those connected to OUTP and OUTM, not shown) will be increased. Although this topology is not as sensitive to these capacitances, a large increase in the capacitances will slow down the rise/fall times (in a non-linear and pattern dependent way) and leads to distortion. In accordance with the applicants' simulation results, the brute force approach led to worse distortion performance.

FIGS. 5A and 5B schematically illustrate an example of another conventional approach to connect the tail node 38 to the bulk 46 of the switch transistors 34a and 34b after a level shift and buffering operations. This will also essentially bootstrap the diodes 44a and 44b associated with the switch transistors 34a and 34b. Since these diodes 44a and 44b will not conduct anymore, a significant portion of the non-linear current can thus be eliminated. By biasing the bulk of the switch transistors close to supply voltage Vcc, as shown in FIG. 6, the junction reverse bias can be increased compared to the above-mentioned solution.

The diodes associated with the switches are bootstrapped, but the N-well 50 now sees all the disturbance at the tail node. The drain-to-N-well junction diodes 52 which form a path between the N-well and the outputs (OUTP, OUTM) carry some of this disturbance back to the output. Furthermore, similar to brute force approach, the N-wells for the switches must all be separated which can lead to significant area penalty. An amplifier/level shifter is needed for each unit current source that can be very power costly for heavily segmented topologies.

Also, this approach still leaves the drain junction diode 42 (see FIG. 5A) associated with the current source 32, unless current source 32 and switch 34 share the same N-well which would lead to even more disturbances. Finally, this approach requires that the switches 34 be put in separate wells. For a PMOS type of switch, a standard CMOS process will handle this requirement but for an NMOS switch, an extra and costly deep N-well option would be necessary. In simulations, this approach did not improve the SFDR at all. Results were similar to the case when no special technique is employed.

BRIEF DESCRIPTION OF THE INVENTION

A circuit dynamically biases switching elements in a current-steering digital-to-analog converter (DAC). The DAC includes a plurality of cells, each cell having a current source and a differential switch coupled to the current source via a current node, the differential switch including a first switching element coupled between the current node and a first DAC output node, and a second switching element coupled between the current node and a second DAC output node. The circuit includes a first input coupled to the first DAC output node, a second input coupled to the second DAC output node, a first output coupled to the first switching element, the first output providing a first ON bias voltage for the first switching element, the first ON bias voltage controlling the first switching element such that a voltage at the current node is maintained at a predetermined voltage, a second output coupled to the second switching element, the second output providing a second ON bias voltage for the second switching element, the second ON bias voltage controlling the second switching element such that a voltage at the current node is maintained at a predetermined voltage, and a third output coupled to the first and second switching elements, the third output providing an OFF bias voltage for the first and second switching elements.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1A is a diagram schematically illustrating a conventional digital-to-analog interface including a digital signal source, an encoder, and a current steering DAC having a driver circuit (switch driver array) and a DAC switch array.

FIG. 1B is a diagram schematically illustrating an example of the switch array of a segmented current steering DAC having thermometer-coded upper 7 bits (MSB) and binary coded lower 5 bits (LSB).

FIGS. 2A and 2B are electrical diagrams schematically illustrating a typical DAC and a corresponding bias generator.

FIGS. 3A and 3B are diagrams explaining the finite impedance of a current source and resulting current distortion.

FIG. 4A is an electrical diagram schematically illustrating several non-linear capacitances connected to nodes in the conventional DAC.

FIG. 4B is an electrical block diagram schematically illustrating the corresponding bias generator for the DAC shown in FIG. 4A.

FIGS. 5A and 5B are electrical diagrams schematically illustrating an example of a conventional approach to bootstrap the diodes associated with switch transistors.

FIG. 6 is a diagram explaining a conventional approach to bootstrap the diodes associated with switch transistors.

FIGS. 7A and 7B are electrical diagrams schematically illustrating a circuit for dynamically biasing switching elements in a current-steering DAC in accordance with one embodiment of the present invention.

FIG. 8 is an electrical diagram schematically illustrating an example of the circuit for dynamically biasing switching elements in a current-steering DAC in accordance with one embodiment of the present invention.

FIG. 9 is a process flow diagram schematically illustrating a method for dynamically biasing switching elements in a current-steering DAC in accordance with one embodiment of the present invention.

FIG. 10 is a diagram schematically illustrating a DAC output signal spectrum of the same DAC with and without the dynamic switch control in accordance with one embodiment of the present invention.

FIGS. 11A and 11B are diagrams schematically illustrating a simulation result of one output (OUTP) of the DAC and the corresponding ON bias voltage VON1, respectively, in accordance with one embodiment of the present invention.

FIGS. 12A and 12B are diagrams schematically illustrating a simulation result of the gate signal of the MSB64 element of the unary portion of the DAC in accordance with one embodiment of the present invention.

FIG. 13A is a diagram schematically illustrating a simulation result of the MSB64 switch element's source with (solid curve) and without (broken curve) the dynamic ON bias correction in accordance with one embodiment of the present invention.

FIG. 13B is a diagram schematically illustrating a simulation result of the replica switching elements' source voltages in accordance with one embodiment of the present invention.

DETAILED DESCRIPTION

Embodiments of the present invention are described herein in the context of a method and apparatus for dynamically biasing switching elements in a current-steering DAC. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine. In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

FIGS. 7A and 7B schematically illustrate a circuit 80 for dynamically biasing switching elements in a current-steering digital-to-analog converter (DAC) 60, in accordance with one embodiment of the present invention. The DAC 60 includes a plurality of cells 62 (62-1, ..., 62-n, ... 62-N). Each cell 62 has a current source 64 and a differential switch 70 coupled to the current source 64 via a current node (tail node) 66. The differential switch 70 (70a, 70b) includes a first switching element 70a coupled between the current node 66 and a first DAC output node 72a, and a second switching element 70b coupled between the current node 66 and a second DAC output node 72b. In this example, as shown in FIG. 7A, the first and second switching elements 70a and 70b, as well as the current sources 64, are implemented using P-type transistors. However, the current sources 64 and the switching elements 70a and 70b may be implemented using N-type transistors, as is well understood by those of ordinary skill in the art.

As shown in FIGS. 7A and 7B, the circuit 80 includes a first input 82a coupled to the first DAC output node 72a, a second input 82b coupled to the second DAC output node 72b, a first output 84a coupled to the first switching element 70a, a second output 84b coupled to the second switching element 70b, and a third output 86 coupled to the first and second switching elements 70a and 70b. The first output 84a provides a first ON bias voltage (VON1) for the first switching element 70a in each cell 62, which controls the first switching element 70a such that a voltage at the current node 66 is maintained at a predetermined value. The second output 84b provides a second ON bias voltage (VON2) for the second switching element 70b in each cell 62. The second ON bias voltage (VON2) controls the second switching element 70b such that a voltage at the current node 66 is maintained at a predetermined value. The third output 86 provides a common OFF bias voltage (VOFF) for the first and second switching elements 70a and 70b in each cell 62.

In accordance with one embodiment of the present invention, the first ON bias voltage (VON1) includes a predetermined DC voltage and a correction voltage modulating the DC voltage so as to compensate a signal coupling from the first DAC output node 72a affecting the current source 64. Similarly, the second ON bias voltage (VON2) includes a predetermined DC component and a correction voltage modulating the DC voltage so as to compensate a signal coupling from the second DAC output node 72b affecting the current source 64. That is, in accordance with the embodiment of the present invention, the signal coupling into the tail node 66 is compensated so as to minimize the associated non-linear behavior of the DAC, not by trying to remove or mask the non-linear component of the current as the conventional approach described above, but by reducing the disturbance itself, i.e., eliminating the source of the problem. The correction signal is added to the gate of the switch element 70 that conducts (either 70a or 70b) via the respective ON bias voltage (VON1 or VON2). In each cell 62, this correction signal modulates the gate of the ON-state switch 70a or 70b such that the current which flows through its source node (i.e. the tail node 66) is constant.

Since the disturbance at the tail node 66 is a function of the output signal (OUTP or OUTM), the correction signal is a properly scaled version of the output signal as well. It can be shown that if the output impedance of the current source 64 is much greater than that of the switch element 70, which is always true in a properly designed DAC, the correction signal at the gate of the switching element 70 is approximately the signal at the drain (OUTP or OUTM) divided by the negative of the intrinsic gain (i.e., transconductance multiplied with output impedance) of the switch element 70 which is assumed to be in the saturation region. It should be noted that the correction signal only needs to be applied to the switch (the switching element 70a or 70b) which is in its ON-state, since an OFF switch will effectively isolate the output node 72a or 72b from the tail node 66. Hence, a practical way of applying the correction voltage is to multiplex it with the ON bias voltage (VON) of the switches as described above. In addition, since either one of the switches 70a and 70b conducts at a given time in each cell 66 in accordance with the input digital data or code, each of them requires a corresponding correction voltage. In a differential implementation, these correction voltages are typically the inverse of each other. In each cell 62, the first ON bias voltage VON1 and the OFF bias voltage VOFF are applied to the switching element 70a via a corresponding driver switch 76a in a driver circuit, and the second ON bias voltage VON2 and the OFF bias voltage VOFF are applied to the switching element 70b via a corresponding driver switch 76b in the driver circuit.

FIG. 8 schematically illustrates an example of the circuit for dynamically biasing switching elements in a current-steering DAC 60 in accordance with one embodiment of the present invention. The blocks 90a, 90b and 100 constitute one particular way of implementing bias generator 80 shown in FIG. 7B. The first bias generator 90a includes a first mirror circuit 92a for the first switching element side of the cell 62, and a first control circuit 94a. The second bias generator 90b includes a second mirror circuit 92b for the second switching element side of the cell 62, and a second control circuit 94b.

In the first bias generator 90a, the first mirror circuit 92a includes a first replica current source 96a coupled to a first node (corresponding to a tail node) 102a, and a first replica switching element 98a coupled between the first node 102a and the first DAC output node 72a. The first replica switching element 98a senses a signal on the first DAC output node 72a via the first input 82a (see FIG. 7B) of the circuit 80. The first control circuit 94a is coupled to the first node 102a, and senses a voltage at the first node 102a and generates a first bias voltage 104a which controls the first replica switching element 98a such that the voltage at the first node 102a is maintained at a predetermined voltage. The first bias voltage 104a is supplied, as the first ON bias voltage, to the first switching element 70a in each cell 62 via a corresponding driver switch (not shown in FIG. 8 for simplicity) in the driver circuit. That is, in each cell 62, the first switching element 70a receives the first ON bias voltage if it is driven to an ON state in accordance with the input digital data.

As shown in FIG. 8, the first control circuit 94a may be implemented using a first amplifier 95a adapted to sense the voltage at the first node 102a and generates the first bias voltage 104a. The first amplifier 95a controls the first replica switching element 98a such that the sensed voltage substantially equals a reference voltage Vref. The first bias voltage 104a is output from the first output 84a (in FIG. 7B) of the circuit 80 as the first ON bias voltage, as described above. For example, the first ON bias voltage includes a DC component (corresponding to the conventional constant ON bias voltage) and a correction voltage compensating a change in the voltage at the first node 102a.

Similarly, in the second bias generator 90b, the second mirror circuit 92b includes a second replica current source 96b coupled to a second node (corresponding to a tail node) 102b, and a second replica switching element 98b coupled between the second node 102b and the second DAC output node 72b. The second replica switching element 98b senses a signal on the second DAC output node 72b via the second input 82b (see FIG. 7B) of the circuit 80. The second control circuit 94b is coupled to the second node 102b, and senses a voltage at the second node 102b and generates the second bias voltage 104b which controls the second replica switching element 98b such that the voltage at the second node 102b is maintained at a predetermined voltage. The second bias voltage 104b is supplied as the second ON bias voltage VON2 to the second switching element 70b in each cell 62 via a corresponding driver switch (not shown in FIG. 8) in the driver circuit. That is, in each cell 62, the first switching element 70b receives the second ON bias voltage if it is driven to an ON-state in accordance with the input digital data.

The second control circuit 94b may be implemented using a second amplifier 95b adapted to sense the voltage at the second node 102b and generates the second bias voltage 104b. The second amplifier 95b controls the second replica switching element 98b such that the sensed voltage substantially equals a reference voltage Vref. The second bias voltage 104b is output from the second output 84b (in FIG. 7B) of the circuit 80 as the second ON bias voltage, as described above. For example, the second ON bias voltage includes a DC component (corresponding to the conventional constant ON bias voltage) and a correction voltage compensating a change in the voltage at the second node 102b.

The third bias generator 100 provides the reference voltage Vref to the first and second bias generators 90a and 90b. The third bias generator 100 also outputs the OFF bias voltage via the third output 86 (FIG. 7B), which is supplied to the first and second switching elements 70a and 70b in each cell 62. The OFF bias voltage (HIGH voltage in this example) may be Vcc or a certain high voltage smaller than Vcc. Similarly, the constant portion of the first and second ON bias voltages (LOW voltage in this example) may be the ground, or a certain low voltage greater than the ground, depending on implementation.

Therefore, in accordance with one embodiment of the present invention, the bias circuit is modified such that it senses the differential DAC outputs OUTP and OUTM and generates the first and second ON bias voltages VON1 and VON2 for the switches whose drains are connected to the first and second DAC outputs OUTP and OUTM, respectively. As mentioned above, the DC value of the first and second ON bias signals VON1 and VON2 can be chosen to be the same as the conventional ON bias VON in FIGS. 2A and 2B, and a small AC correction signal rides on the respective DC ON bias voltage for each cell 62.

FIG. 9 schematically illustrates a method for dynamically biasing switching elements in a current-steering DAC in accordance with one embodiment of the present invention. The DAC may be DAC 60 described in the above embodiments, which includes a plurality of cells, Each cell includes a current source coupled to a current node (tail node), a first switching element coupled between the current node and a first DAC output node, and a second switching element coupled between the current node and a second DAC output node. A first mirror circuit and a second mirror circuit are provided for the cells (200). The first mirror circuit is coupled to the first DAC output node, and includes a first replica current source and a first replica switching element, which are identical (in terms of the available process technology) to the first current source and the first switching element in each cell. The first replica switching element is coupled to the first replica current source via a first node (corresponding to a tail node). The second mirror circuit is coupled to the second DAC output node, and includes a second replica current source and a second replica switching element, which are identical (in terms of the available process technology) to the second current source and the second switching element in each cell in terms of the available process technology. The second replica switching element is coupled to the second replica current source via a second node (corresponding to a tail node).

A first voltage at the first node is monitored (202), which corresponds to a voltage at the current node (tail node) in each cell when the corresponding first switching element is ON. A first ON bias voltage is generated (204) for the first replica switching element such that the first voltage is maintained at a predetermined voltage, and provided (206) to the first switching element in each cell. Similarly, a second voltage at the second node is monitored (208), which corresponds to a voltage at the current node in each cell when the corresponding second switching element is ON. A second ON bias voltage is generated (210) for the second replica switching element such that the second voltage is maintained at a predetermined voltage, and provided (212) to the second switching element in each cell. A common OFF bias voltage is provided for the first and second switching elements in each cell when they are to be in the OFF-state (214).

The first ON bias voltage may be generated by receiving a DC bias voltage, receiving a reference voltage, and modulating the DC bias voltage based on a difference between the first voltage and the reference voltage. Similarly, the second ON bias voltage may be generated by receiving a DC bias voltage, receiving a reference voltage, and modulating the DC bias voltage based on a difference between the second voltage and the reference voltage.

Referring back to FIG. 8, the method for dynamo ically biasing switching elements in a current-steering DAC in accordance with one embodiment of the present invention is also described as follows. The embodiment illustrated in FIG. 8 is one implementation where the correction signals are generated in a process and temperature independent manner. In this embodiment, as described above, two extra currents sources (replica current sources 96a and 96b) with their associated switches (replica switching elements 98a and 98b) are connected to the DAC output OUTP and OUTM (the output node 72a and 72b), respectively. The replica current sources 96*a* and 96*b* and the replica switches 98*a* and 98*b* are identical to the current sources 64 and the switching elements 70 which are used in respective cells 64 in the core DAC. However. unlike those elements in the core DAC, the extra switches 98*a* and 98*b* are inside a negative feedback loop employing amplifiers 95*a* and 95*b* in the first and second bias generators 90*a* and 90*b*, respectively.

The reference voltage Vref sets the DC value of the first and second ON bias voltages VON1 and VON2. The drains of the replica switches 98*a* and 98*b* sense their associated outputs OUTP and OUTM, respectively. In the first bias generator 90*a*, output OUTP, as is that in each cell 64, tries to couple to the tail node (i.e., the first node) 102*a*. Similarly, in the second bias generator 90*b*, output OUTM tries to couple to the tail node (i.e., the second node) 102*b*. However, the amplifiers 95*a* and 95*b* sense the respective coupling and generate the appropriate correction signals at the gate of the corresponding replica switch 98*a* or 98*b* so as to keep the tail nodes 102*a* and 102*b* at the reference voltage Vref. Employing symmetry and excellent matching available in modem IC processes technologies, when applied to the gate of the core DAC switches 70*a* and 70*b* in each cell 64, the ON bias voltages VON1 and VON2 will keep the associated tail nodes 66 at the constant reference potential Vref. This in turn eliminates the non-linear current component at the tail nodes 66 and removes the main distortion mechanism in the DAC.

It should be noted that although in the above embodiments the DAC is described as having identical unary cells 62, the present invention is also applicable to binary DACs, segmented DACs, or preferably unary portion of a segmented DAC.

FIGS. 10–13B schematically illustrate the operation of dynamic switch control in a current-steering DAC in accordance with one embodiment of the present invention. Plots in these figures are obtained by circuit level simulations. In these examples, a 12-bit DAC is running at 140 MHz and generating a 5 MHz sine wave output. Similar to the DAC switch array 18 shown in FIG. 1B, the first five bits of the DAC are binary and the upper seven bits are unary. Therefore, the DAC includes 127-currents sources (and associated switches) which have a value of 32I, and 5-current sources with values of 16I, 8I, 4I, 2I and I, respectively, where I is about 2.5uA. The dynamic switch control is applied to all the 127 unary current sources and switches. The unary DAC cells are denoted as MSB1, MSB2, . . . , MSB127.

FIG. 10 schematically illustrates a DAC output signal spectrum of the same DAC with and without the dynamic switch control in accordance with one embodiment of the present invention. The solid curve represents the output signal using the above-described dynamic switch control (ON bias correction), and the broken curve represents the output signal from the conventional DAC without the dynamic switch control. As shown in FIG. 10, close to 20 dB improvement at the 3rd harmonic is achieved in accordance with one embodiment of the present invention.

FIGS. 11A and 11B schematically illustrate one output (OUTP) of the DAC and the corresponding output of the amplifier, i.e., the ON bias voltage VON1, respectively, in accordance with one embodiment of the present invention. The complementary output (OUTM) of the DAC is not shown. As described above, the amplifier is in a feedback loop with a replica current source and a switch element which senses the particular DAC output (OUTP or OUTM). The reference voltage (Vref) input of the amplifier is about 1.5V. It should be noted that at the output of the amplifier (i.e., the gate of the replica switch or the ON bias voltage VON1 ), there is a small correction signal (about 7 mV peak-to-peak) with opposite polarity to the DAC output (OUTP). This signal has a DC value of about 100 mV and it helps the first node (the replica switch source) to be about equal to Vref as is be shown in FIGS. 13A and 13B described below.

FIGS. 12A and 12B schematically illustrate the gate signal of the MSB64 element of the unary portion of the DAC in accordance with one embodiment of the present invention. Here, the OFF bias voltage VOFF is about 1.3V and the ON bias voltage VON1 is about 100 mV. A close up of the gate voltage shows that a correction signal equal to the output of the amplifier rides on it. By virtue of good matching which exists in modern IC processes, this correction signal also maintains the source of the MSB64 switch almost constant thereby eliminating a major distortion source. It should be noted the MSB64 element is used as an example, and this applies to all of the 127 unary switching elements not just the MSB64 element.

FIG. 13A schematically illustrates the MSB64 switch element's source with (solid curve) and without (broken curve) the dynamic ON bias correction. It should be noted that without the correction there is a signal with peak-to-peak amplitude of about 3 mV. This signal is correlated with the DAC output (in fact it is a rectified version of it) and hence causes distortion. On the other hand, the correction reduces the distortion to less than 0.3 mV. For reference, FIG. 13B schematically illustrates the replica switching element's source. They are held very constant at about 1.5V, and there is only 0.3 mV variation on them just like the MSB64 switch element's source. Precise matching between the replica circuit (currents source and switching element) and the DAC switching cells realizes the good correction results.

As described above, in accordance with embodiments of the present invention, the disturbance at the tail node is substantially eliminated rather than just masking it. Instead of a constant ON bias voltage, the present invention uses an ON bias voltage for each differential side which carries a correction signal thereon. It can be combined with constant activity schemes like quad switching. The present invention realizes better dynamic performance of the DAC. For example, simulated performance for a VDSL DAC running at 140 MHz is improved from an SFDR of 85 dB (at 5 MHz) to over 95 dB (at 5 MHz) using this approach. The extra power consumption was about 20% of the core DAC. The SFDR can be improved even further with better and/or more powerful amplifiers. For instance, an amplifier which provides 40 dB gain at five MHz pushed the SFDR below 105 dB. In simulations, no other approach gave comparable results. In addition, the DAC in accordance with the present invention has a lower power consumption compared to prior art. Only two amplifiers are needed for a 7+5 segmented DAC, as opposed to 127 with prior art, assuming that the correction is applied only to the segment currents where it matters the most. Furthermore, it requires a smaller area compared to prior art, since there is no need for separating the wells. This leads to more compact layout of the circuit.

In addition, the present invention may be applied to both PMOS and NMOS type switches without extra process steps. In the case where the present invention is used in a DAC employing NMOS switches, the ON voltage will be a high voltage. If a regulator generates the supply voltages for the switch drivers, the correction voltage can be mixed to the positive supply output of the regulator. The present invention may also be used in a purely binary DAC. In this case, power and area advantages may not be there anymore but the dynamic performance will still be improved. A compromise solution would be to employ this linearization technique to a few MSB's where the distortion affects the performance the most.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A circuit for dynamically biasing switching elements in a current-steering digital-to-analog converter (DAC), the DAC including a plurality of cells, each cell having a current source and a differential switch coupled to the current source via a current node, the differential switch including a first switching element coupled between the current node and a first DAC output node, and a second switching element coupled between the current node and a second DAC output node, said circuit comprising:
   a first input coupled to the first DAC output node;
   a second input coupled to the second DAC output node;
   a first output coupled to the first switching element, said first output providing a first ON bias voltage for the first switching element, the first ON bias voltage controlling the first switching element such that a voltage at the current node is maintained at a predetermined voltage;
   a second output coupled to the second switching element, said second output providing a second ON bias voltage for the second switching element, the second ON bias voltage controlling the second switching element such that a voltage at the current node is maintained at a predetermined voltage; and
   a third output coupled to the first and second switching elements, said third output providing an OFF bias voltage for the first and second switching elements.

2. The circuit of claim 1, wherein the first ON bias voltage includes:
   a predetermined DC voltage; and
   a correction voltage modulating the DC voltage so as to compensate a signal coupling from the first DAC output node affecting the current through the switching element.

3. The circuit of claim 1, wherein the second ON bias voltage includes:
   a predetermined DC component; and
   a correction voltage modulating the DC voltage so as to compensate a signal coupling from the second DAC output node affecting the current through the switching element.

4. The circuit of claim 1, further comprising:
   a first bias generator including:
      a first replica current source coupled to a first node;
      a first replica switching element coupled between the first node and said first input, the first replica switching element sensing a signal on the first DAC output node via said first input; and
      a first amplifier adapted to sense a voltage at the first node and generate a first bias voltage controlling the first replica switching element such that the sensed voltage substantially equals a reference voltage, the first bias voltage being output from said first output as the first ON bias voltage;
   a second bias generator including:
      a second replica current source coupled to a second node;
      a second replica switching element coupled between the second node and said second input, the second replica switching element sensing a signal on the second DAC output node; and
      a second amplifier adapted to sense a voltage at the second node and generate a second bias voltage controlling the second replica switching element such that the sensed voltage substantially equals a reference voltage, the second bias voltage being output from said second output as the second ON bias voltage;
   a third bias generator adapted to provide the reference voltage to said first and second bias generators and to output the OFF bias voltage via said third output.

5. The circuit of claim 1, wherein said first and second switching elements are transistors.

6. A circuit for dynamically biasing switching elements in a current-steering digital-to-analog converter (DAC), the DAC including a plurality of cells, each cell including a current source, a first switching element coupled between the current source and a first DAC output node, and a second switching element coupled between the current source and a second DAC output node, said circuit comprising:
   a first mirror circuit, including:
      a first replica current source coupled to a first node; and
      a first replica switching element coupled between the first node and the first DAC output node, the first replica switching element sensing a signal on the first DAC output node;
   a first control circuit coupled to the first node, the first control circuit sensing a voltage at the first node and generating a first ON bias voltage controlling the first replica switching element such that the voltage at the first node is maintained at a predetermined voltage, the first ON bias voltage being supplied to the first switching element in each cell;
   a second mirror circuit, including:
      a second replica current source coupled to a second node; and
      a second replica switching element coupled between the second node and the second DAC output node, the second replica switching element sensing a signal on the second DAC output node;
   a second control circuit coupled to the second node, the second control circuit sensing a voltage at the second node and generating a second ON bias voltage controlling the second replica switching element such that the voltage at the second node is maintained at a predetermined voltage, the second ON bias voltage being supplied to the second switching element in each cell; and
   a bias generator adapted to generate an OFF bias voltage for the first and second switching elements of each cell.

7. The circuit of claim 6, wherein said first control circuit includes:
   a first amplifier coupled to the first node and to a reference voltage, said first amplifier driving the first replica switching element such that the voltage at the first node substantially equals the reference voltage.

8. The circuit of claim 7, wherein said bias generator further adapted to generate the reference voltage for the first amplifier.

9. The circuit of claim 6, wherein said second control circuit includes:
   a second amplifier coupled to the second node and to a reference voltage, said second amplifier driving the second replica switching element such that the voltage at the second node substantially equals the reference voltage.

10. The circuit of claim 9, wherein said bias generator further adapted to generate the reference voltage for the second amplifier.

11. The circuit of claim 6, wherein the first ON bias voltage includes:
   a DC component; and
   a correction voltage compensating a change in the voltage at the first node.

12. The circuit of claim 6, wherein the second ON bias voltage includes:
   a DC component; and
   a correction voltage compensating a change in the voltage at the second node.

13. The circuit of claim 6, wherein said first and second switching elements are transistors.

14. A method for dynamically biasing switching elements in a current-steering digital-to-analog converter (DAC), the DAC including a plurality of cells, each cell including a current source coupled to a current node, a first switching element coupled between the current node and a first DAC output node, and a second switching element coupled between the current node and a second DAC output node, said method comprising:
   monitoring a first voltage at a first node using a first mirror circuit coupled to the first DAC output node, the first mirror circuit including a first replica current source and a first replica switching element coupled to the first replica current source via the first node, the first voltage corresponding to a voltage at the current node when the first switching element is ON;
   generating a first ON bias voltage for the first replica switching element such that the first voltage is maintained at a predetermined voltage;
   providing the first ON bias voltage to the first switching element in each cell;
   monitoring a second voltage at a second node using a second mirror circuit coupled to the second DAC output node, the second mirror circuit including a second replica current source and a second replica switching element coupled to the second replica current source via the second node, the second voltage corresponding to a voltage at the current node when the second switching element is ON;
   generating a second ON bias voltage for the second replica switching element such that the second voltage is maintained at a predetermined voltage;
   providing the second ON bias voltage to the second switching element in each cell; and
   providing an OFF bias voltage for the first and second switching elements in each cell.

15. The method of claim 14, wherein said generating the first ON bias voltage includes:
   receiving a DC bias voltage;
   receiving a reference voltage;
   modulating the DC bias voltage based on a difference between the first voltage and the reference voltage.

16. The method of claim 14, wherein said generating the second ON bias voltage includes:
   receiving a DC bias voltage;
   receiving a reference voltage;
   modulating the DC bias voltage based on a difference between the second voltage and the reference voltage.

17. An apparatus for dynamically biasing switching elements in a current-steering digital-to-analog converter (DAC), the DAC including a plurality of cells, each cell including a current source coupled to a current node, a first switching element coupled between the current node and a first DAC output node, and a second switching element coupled between the current node and a second DAC output node, said apparatus comprising:
   means for monitoring a first voltage at a first node using a first mirror circuit coupled to the first DAC output node, the first mirror circuit including a first replica current source and a first replica switching element coupled to the first replica current source via the first node, the first voltage corresponding to a voltage at the current node when the first switching element is ON;
   means for generating a first ON bias voltage for the first replica switching element such that the first voltage is maintained at a predetermined voltage;
   means for providing the first ON bias voltage to the first switching element in each cell;
   means for monitoring a second voltage at a second node using a second mirror circuit coupled to the second DAC output node, the second mirror circuit including a second replica current source and a second replica switching element coupled to the second replica current source via the second node, the second voltage corresponding to a voltage at the current node when the second switching element is ON;
   means for generating a second ON bias voltage for the second replica switching element such that the second voltage is maintained at a predetermined voltage;
   means for providing the second ON bias voltage to the second switching element in each cell; and
   means for providing an OFF bias voltage for the first and second switching elements in each cell.

18. The apparatus of claim 17, wherein said means for generating the first ON bias voltage includes:
   means for receiving a DC bias voltage;
   means for receiving a reference voltage;
   means for modulating the DC bias voltage based on a difference between the first voltage and the reference voltage.

19. The apparatus of claim 17, wherein said means for generating the second ON bias voltage includes:
   means for receiving a DC bias voltage;
   means for receiving a reference voltage;
   means for modulating the DC bias voltage based on a difference between the second voltage and the reference voltage.

20. A current-steering digital-to-analog converter (DAC), comprising:
   a plurality of current sources;
   a plurality of differential switches, each of the differential switches coupled to a corresponding current source via a corresponding current node, each of the differential switches including:
      a first switching element coupled between the current node and a first DAC output node; and
      a second switching element coupled between the current node and a second DAC output node;
   a first mirror circuit coupled to the first DAC output node, the first mirror circuit including:
      a first replica current source; and
      a first replica switching element coupled to the first replica current source via a first node;
   a first bias generator coupled to the first node and the first replica switching element, the first bias generator sensing a voltage at the first node and generating a first ON bias voltage to control the first replica switching element such that the voltage at the first node is maintained at a predetermined voltage, the first ON bias voltage being supplied to each of the first switching elements;
a second mirror circuit coupled to the second DAC output node, the second mirror circuit including:
a second replica current source;
a second replica switching element coupled to the second replica current source via a second node;
a second bias generator coupled to the second node and the second replica switching element, the second bias generator sensing a voltage at the second node and generating a second ON bias voltage to control the second replica switching element such that the voltage at the second node is maintained at a predetermined voltage, the second ON bias voltage being supplied to each of the second switching elements; and
a third bias generator coupled to each of the first and second switching elements, the bias generator generating an OFF bias voltage for the first and second switching elements.

21. The DAC of claim 20, wherein:
said first bias generator generates the first ON bias based on a difference between the voltage sensed at the first node and a reference voltage;
said second bias generator generates the second ON bias based on a difference between the voltage sensed at the second node and a reference voltage; and
said third bias generator further generates the reference voltage for the first and second bias generators.

22. The DAC of claim 20, wherein said first and second switching elements are transistors.

23. The DAC of claim 20, wherein said first bias generator includes:
a first amplifier coupled to the first node and to a reference voltage, said first amplifier driving the first replica switching element such that the voltage at the first node substantially equals the reference voltage.

24. The DAC of claim 23, wherein said bias generator further adapted to generate the reference voltage for the first amplifier.

25. The DAC of claim 20, wherein said second bias generator includes:
a second amplifier coupled to the second node and to a reference voltage, said second amplifier driving the second replica switching element such that the voltage at the second node substantially equals the reference voltage.

26. The DAC of claim 25, wherein said bias generator further adapted to generate the reference voltage for the second amplifier.

* * * * *